United States Patent
Linam et al.

(10) Patent No.: US 7,132,870 B2
(45) Date of Patent: Nov. 7, 2006

(54) DIFFERENTIAL REGISTER SLAVE STRUCTURE

(75) Inventors: David L. Linam, Ft. Collins, CO (US); Scott T. Evans, Ft. Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/817,184

(22) Filed: Apr. 2, 2004

(65) Prior Publication Data

US 2005/0218949 A1    Oct. 6, 2005

(51) Int. Cl.
*H03K 3/289* (2006.01)
*H03K 3/356* (2006.01)

(52) U.S. Cl. .................. 327/202; 327/203; 327/218
(58) Field of Classification Search ............. 327/202, 327/203, 208, 209, 210, 211, 212, 218
See application file for complete search history.

(56) References Cited

U.S. PATENT DOCUMENTS

| 4,873,456 | A | * | 10/1989 | Olisar et al. ............. 327/202 |
| 4,939,384 | A | * | 7/1990 | Shikata et al. ............. 327/212 |
| 5,001,361 | A | * | 3/1991 | Tamamura et al. ......... 327/202 |
| 5,508,648 | A | * | 4/1996 | Banik .................... 327/203 |
| 6,191,629 | B1 | * | 2/2001 | Bisanti et al. ............ 327/202 |
| 6,239,640 | B1 | * | 5/2001 | Liao et al. ............... 327/218 |
| 6,417,711 | B1 | * | 7/2002 | Fulkerson ................ 327/203 |
| 6,720,813 | B1 | * | 4/2004 | Yee et al. ................ 327/218 |
| 6,864,732 | B1 | * | 3/2005 | Chalasani ............... 327/203 |
| 2003/0107421 | A1 | * | 6/2003 | Markovic et al. ......... 327/211 |

FOREIGN PATENT DOCUMENTS

| JP | 1-97008 | * | 4/1989 |
| JP | 1-248820 | * | 10/1989 |
| JP | 5-37305 | * | 2/1993 |
| JP | 05-037305 | * | 12/1993 |
| JP | 6-29791 | * | 2/1994 |

* cited by examiner

Primary Examiner—Tuan T. Lam

(57) ABSTRACT

A differential register slave structure is presented. In one embodiment, a differential register includes a storage node (218, 318). The storage node (218, 318) stores and holds the differential values generated by the differential register. In one embodiment of the present invention, on power-up, when the state of various clocks (i.e., master, slave) in the differential register may be indeterminate, the storage node (218, 318) will discharge the differential values and the differential register will produce a differential output.

8 Claims, 3 Drawing Sheets

DIFFERENTIAL REGISTER SLAVE STRUCTURE

BACKGROUND OF THE INVENTION

1. Field of the Invention

This invention relates to electronics systems. Specifically, the present invention relates to electronic circuits.

2. Description of the Related Art

A variety of digital devices are implemented in electronic systems. The digital devices include inputs, logic devices, storage devices, clocks, outputs, etc. Many digital devices are implemented with a master-slave architecture. In a master-slave architecture, the operation of the slave component(s) are often based on the operation of at least one master component.

One conventional type of master-slave architecture is a master-slave latch. A master-slave latch (i.e., differential master-slave latch) includes at least one input port and at least two output ports. The output ports typically produce complimentary outputs. For example if a first output Q produces a logical 1 the second output Qn will produce a logical 0.

FIG. 1 displays a differential architecture. An input node is shown as 100. A pass gate 102 is positioned in series with the input node 100. The pass gate 102 is controlled by a master clock 103. A storage node 104 is positioned in series with the pass gate 102. An inverter 114 is coupled to the storage node 104. A pass gate 108, a storage node 106 and an inverter 115 are each positioned in series. The pass gate 108 is controlled by a slave clock 109. An output node Q shown as 116 is in series with the inverter 115.

A pass gate 112 is positioned on the output of the storage node 104. A storage node 110 and an inverter 118 are in series with the pass gate 112. A slave clock 111 controls the pass gate 112. A complimentary output node Qn is shown as 120. In this embodiment, the slave clocks 109 and 111 are the same clock.

During operation the master clock 103 operates pass device 102 and the slave clock (109 and 111) operates pass devices 108 and 112 respectively. As input is applied to node 100. The pass device 102 operates under control of the master clock 103. When the master clock 103 goes high, the data applied to input node 100 propagates to the storage node 104.

When the master clock 103 goes low that data is held by the master storage node 104. When the slave clock (109, 111) goes high, pass devices 108 and 112 allow data to pass. The data stored in storage node 104 propagates through inverter 114, through pass device 108 to storage node 106 and through pass device 112 to storage node 110. As a result of inverter 114 each individual storage nodes 106 and 110 will store an opposite value.

When the slave clock (109, 111) goes low, the two values stored in the storage nodes 106 and 110 are held independently of each other and propagated to the output Q 116 and the compliment of the output Qn 120. The data is then inverted using inverters 115 and 118, respectively and output at output node Q 116 and the compliment of output node Qn 120.

The problem with the foregoing structure is that on power-up the slave clock (109, 111) may remain at low voltage after the power is applied and it is possible and even likely that the storage nodes (106, 110) may initially power-up in the same state. The same values stored in storage node 106 and storage node 110 will drive either a pair of logical ones or a pair of logical zeros out of the output node Q 116 and the compliment of the output node Qn 120. Given that this circuit is a differential circuit this will cause a problem for any downstream circuits that may be sensitive to non-complimentary inputs, since the differential circuit is initially not producing a differential output.

Thus, there is a need for a differential circuit that is designed to assure a differential output on power-up. There is a need for a differential circuit that is designed to assure a differential output during all phases of operation.

SUMMARY OF THE INVENTION

In one embodiment, a differential circuit is presented which assures a differential output during power-up and during operations. In one embodiment, the differential circuit is implemented as a differential register slave structure. The differential register slave structure includes a storage node that couples the outputs of the differential register slave structure.

In one embodiment, two pass gates (i.e., first and second) are implemented each controlled by a slave clock. Cross-coupled inverters are deployed between the outputs Q and Qn. Further, the output (Q) is in series with a first pass gate and the complimentary output (Qn) is in series with a second pass gate. The storage node stores a value processed through each pass gate when the pass gates are closed. As a result, on power up, the initial values that are propagated are guaranteed to be complimentary.

A differential register, comprising an input conveying an input signal; a first pass device coupled to the input and enabling conveyance of a first signal in response to the input signal; a second pass device coupled to the input and enabling conveyance of a second signal in response to the input signal, wherein the second signal is the compliment of the first signal; and a first storage node coupled to the first pass device and coupled to the second pass device, the first storage node storing the first signal in response to the first pass device enabling conveyance of the first signal and the first storage node storing the second signal in response to the second pass device enabling conveyance of the second signal.

A circuit, comprises an input conveying an input signal; a first pass gate coupled to the input and enabling a first signal in response to the input signal and in response to a master clock signal generating a clock signal; a first storage node coupled to the first pass gate and storing the first signal; a second pass gate coupled to the first storage node and enabling a second signal in response to the first signal stored in the first storage node and in response to a slave clock signal, wherein the slave clock generates is a compliment to the clock signal; a first inverter coupled to the first storage node and generating a first inverted signal in response to the first signal stored in the first storage node; a third pass gate coupled to the first inverter and enabling a third signal in response to the first inverted signal and in response to the slave clock signal; and a second storage node coupled to the second pass gate and coupled to the third pass gate, the second storage node storing the second signal and the third signal.

A method of operating a differential register, the differential register comprising an output node, a complimentary output node and a storage node coupled between the output node and the complimentary output node, the method comprises the steps of storing a first value in the storage node; storing the compliment of the first value in the storage node; and on power-up, conveying the first value stored in the storage node out of the output node and conveying the compliment of the first value stored in the storage node out of the complimentary output node.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
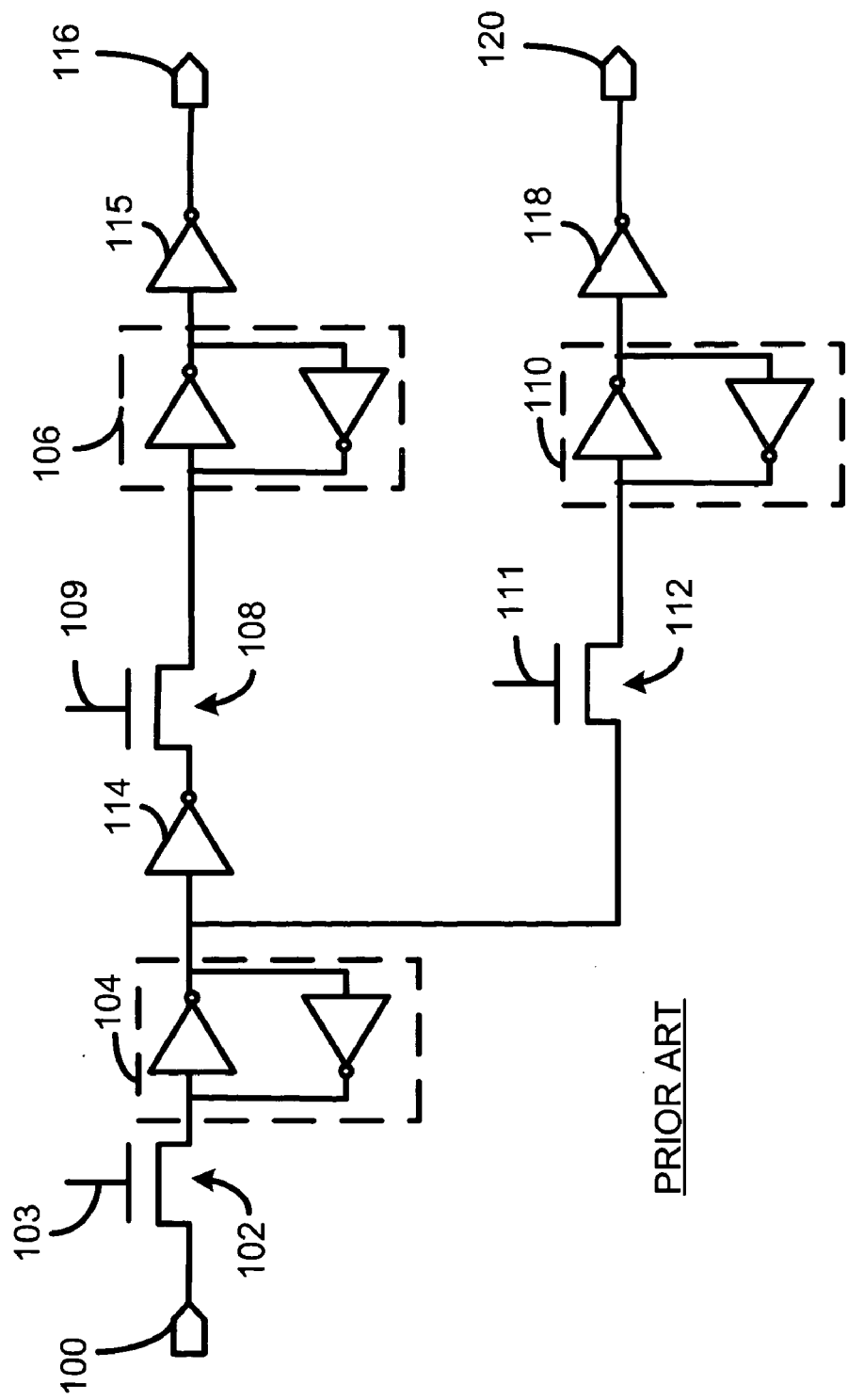
FIG. 1 displays a conventional master-slave architecture.
Figure 2:
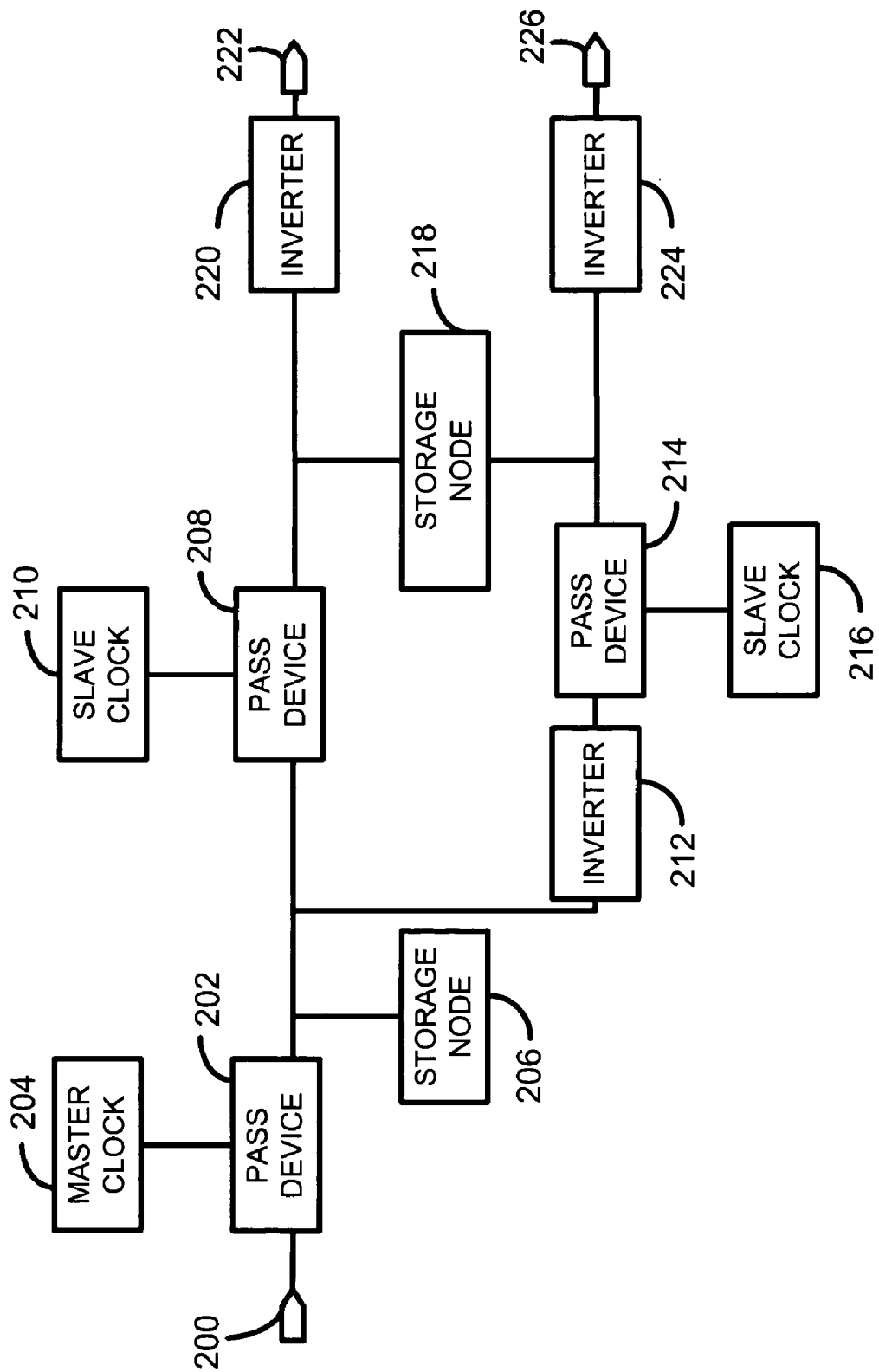
FIG. 2 displays a block diagram depictions of an embodiment of a differential slave structure implemented in accordance with the teachings of the present invention.

FIG. 2 displays a block diagram depictions of an embodiment of a differential slave structure implemented in accordance with the teachings of the present invention. An input node is shown as 200. A pass device 202 and a storage node 206 are in series with the input node 200. The pass device 202 is controlled by a master clock 204.

A pass device 208 is coupled to the pass device 202. A slave clock 210 controls the pass device 208. An inverter 212 is coupled to the storage node 206. A pass device 214 is shown in series with the inverter 212. A slave clock 216 controls the pass device 214. In one embodiment, the slave clock 210 and the slave clock 216 provide the same timing signals to the pass device 208 and the pass device 214, respectively.

A storage node 218 is positioned on the output of pass device 208 and pass device 214 and couple pass device 208 and pass device 214. Inverters 220 and 224 are coupled to the storage node 218. Output node Q 222 is in series with inverter 220 and output node Qn 226 is in series with the inverter 224.

During operation an input signal is applied to input node 200. When the master clock 204 goes high the pass device 202 operates and the input signal applied to the input node 200 is stored in the storage node 206. In one embodiment, the slave clock 210 and 216 are the compliment of the master clock 204.

When the master clock 204 transitions low and the slave clocks 210 and 216 transition high the value stored in storage node 206 propagates through the remainder of the circuit. For example, when the slave clock 210 transitions high the pass device 208 operates and the value in storage node 206 propagates and is stored in storage device 218. When the slave clock 216 transitions high, the pass device 214 operates and the value in storage node 206 is inverted in inverter 212 and then stored in storage node 218. It should be appreciated that in one embodiment of the storage node 218 a separate device and/or combination of devices are used to store signals propagated through pass device 208 and pass device 214. The signal propagated through pass device 208 is inverted in inverter 220 and output through output node Q 222. The signal propagated through pass device 214 is inverted in inverter 224 and output through the compliment of output node Qn 226.

The circuit of FIG. 2 facilitates two separate types of operation, normal operation and power-up operation. During normal operation, when the slave clock 210, 216 rises, differential data is fed into the storage node 218 through the pass devices (208, 214). When the slave clock (210, 216) falls the storage node 218 acts as a common storage node 218, holding the value and its compliment that was previously input.

During power-up the state of the slave clock (210, 216) is indeterminate for some time and may remain low for an extended period. If the slave clock (210, 216) remains low for some time period the storage node 218 will very rapidly settle to a stable state that will drive opposite (i.e., differential) values out of the output Q 222 and the compliment of the output Qn 226 protecting downstream circuits that may be sensitive to non-differential inputs.

Figure 3:
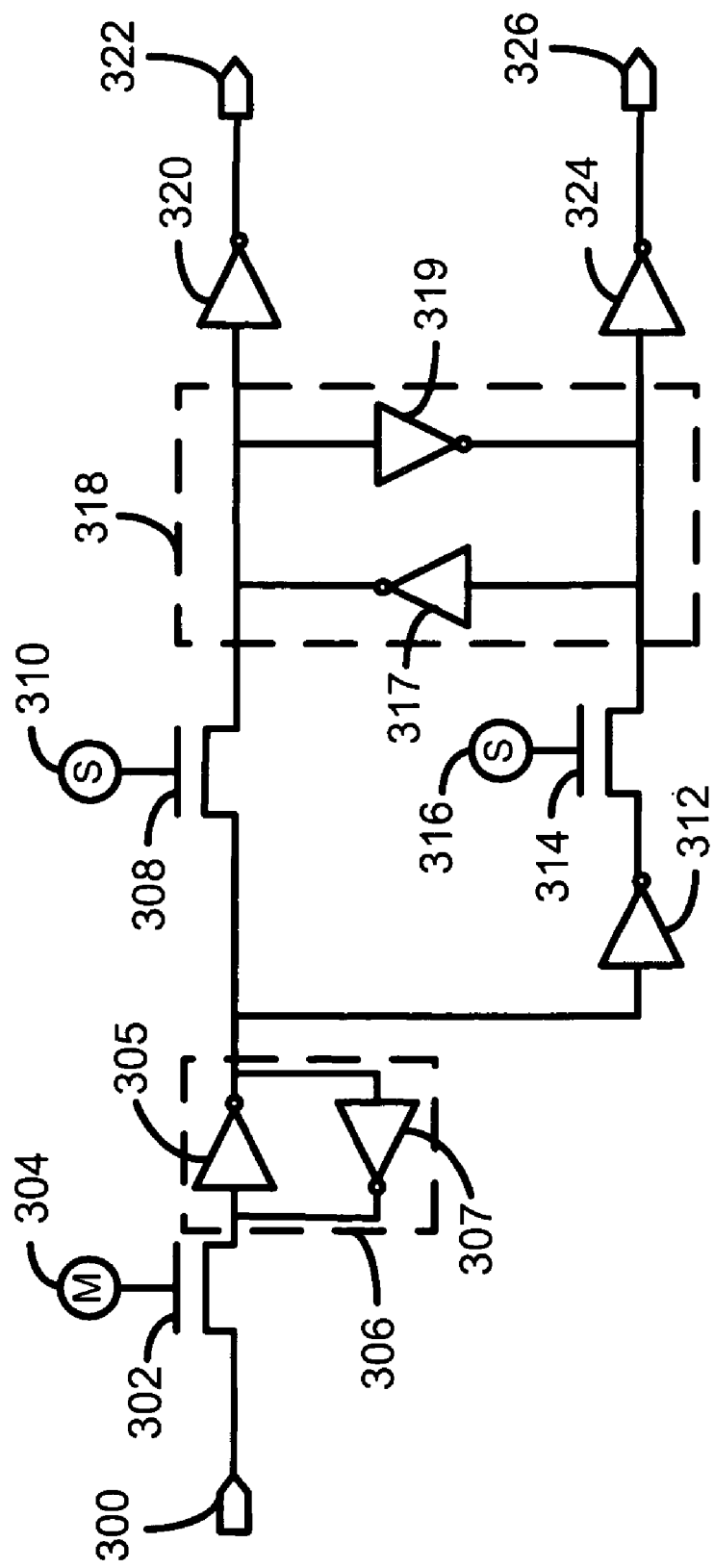
FIG. 3 displays a circuit implementation of an embodiment of a differential slave structure implemented in accordance with the teachings of the present invention.

FIG. 3 displays a circuit implementation of an embodiment of a differential slave structure implemented in accordance with the teachings of the present invention. In FIG. 3 input node 200 is implemented with input node 300. Master clock 204 and slave clock 210, 216 are implemented with master clock 304 and slave clock 310, 316, respectively. Pass device 202, 208 and 214 are implemented with pass gate 302, 308 and 314, respectively. Inverter 212, 220 and 224 are implemented with inverter 312, 320 and 304, respectively.

Storage node 206 is implemented with storage node 306. In one embodiment, storage node 306 is implemented with cross-coupled inverters 305 and 307. Storage node 218 is implemented with storage node 318. In one embodiment, storage node 318 is implemented with cross-coupled inverters 317 and 319. However, it should be appreciated that the storage node 318 may be implemented with a variety of different configurations and still remain within the scope of the present invention.

The input node is shown as 300. The pass device 302 and the storage node 306 are in series with the input node 300. The pass device 302 is controlled by a master clock 304.

The pass device 308 is coupled to the pass device 302 through inverter 305. The slave clock 310 controls the pass device 308. The inverter 312 is coupled to the storage node 306. The pass device 314 is shown in series with the inverter 312. The slave clock 316 controls the pass device 314. In one embodiment, the slave clock 310 and the slave clock 316 provide the same timing signals to the pass device 308 and the pass device 314, respectively.

The storage node 318 is positioned on the output of pass device 308 and pass device 314 and couple pass device 308 and pass device 314. Inverters 320 and 324 are coupled to the storage node 318. Output node Q 322 is in series with inverter 320 and the inverter 324 is in series with the complement of the output node Qn 326.

During operation an input signal is applied to input node 300. When the master clock 304 transitions high the pass device 302 operates and the input signal applied to the input node 300 is stored in the storage node 306. In one embodiment, the slave clock 310 and 316 are the compliment of the master clock 304.

When the master clock 304 transition low and the slave clock 310 and 316 transition high the value stored in storage node 306 propagates through the remainder of the circuit. For example, when the slave clock 310 transitions high the pass device 308 operates and the value in storage node 306 propagates and is stored in storage node 318. When the slave clock 316 transitions high, the pass device 314 operates and the value in storage node 306 is inverted in inverter 312 and then stored in storage node 318. It should be appreciated that in one embodiment, the storage node 318 is implemented with two inverters 317 and 319 working in concert to store complimentary values.

The circuit of FIG. 3 provides for normal operation and power-up operation. During normal operation, when the slave clock (310, 316) rises, differential data is fed into the differential storage node 318 (i.e., inverter 317, inverter 319) through the pass gates (308, 314). When the slave clock (310, 316) falls the inverters 317 and 319 acts as a common storage node 318, holding the value that was previously input.

During power-up the state of the slave clock (310, 316) is indeterminate for some time and may remain low for an extended period. If the slave clock (310, 316) remains low for some time period inverter 317 and inverter 319 will very rapidly settle to a stable state that will drive opposite (i.e., differential) values out of the output Q 322 and the compliment of the output Qn 326 protecting downstream circuits that may be sensitive to non-differential inputs.

In one embodiment, both inverter 317 and inverter 319 are implemented as weak inverters in relation to the inverters (i.e., 305 and 312) on the input of the pass gates 308, 314, respectively. For example, inverter 317 is implemented as a weak inverter relative to inverter 305 so that inverter 305 can overdrive inverter 317. Inverter 319 is implemented as a weak inverter relative to inverter 312 so that inverter 312 can overdrive inverter 319.

Thus, the present invention has been described herein with reference to a particular embodiment for a particular application. Those having ordinary skills in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A circuit, comprising:
an input conveying an input signal:
a first pass gate coupled to the input and enabling a first signal in response to the input signal and in response to a master clock signal generating a clock signal;
a first storage node having an input coupled to the first pass gate and having an output storing the first signal;
a second pass gate connected to the output of the first storage node and enabling a second signal in response to the first signal stored on the output of the first storage node and in response to a slave clock signal, wherein the slave clock is a compliment to the master clock signal;
a first inverter connected to the output of the first storage node and generating a first inverted signal in response to the first signal stored on the output of the first storage node;
a third pass gate connected to the first inverter and enabling a third signal in response to the first inverted signal and in response to the slave clock signal; and
an unclocked second storage node having a signal node coupled to the second pass gate and having a complementary signal node coupled to the third pass gate, the signal node storing the second signal and the complementary signal node storing the third signal.

2. A circuit as set forth in claim 1, further comprising a second inverter coupled to the second storage node, the second inverter generating an output signal; and a third inverter coupled to the second storage node, the third inverter generating a compliment of the output signal.

3. A circuit as set forth in claim 2, wherein the first storage node further comprises a fourth inverter and a fifth inverter configured as back-to-back inverters.

4. A circuit as set forth in claim 3, wherein the second storage node further comprises a sixth inverter and a seventh inverter configured as back-to-back inverters, wherein the sixth inverter is weak relative to the fourth inverter.

5. A circuit as set forth in claim 2, wherein the second storage node further comprises a fourth inverter and a fifth inverter configured as back-to-back inverters.

6. A circuit as set forth in claim 5, wherein the fourth inverter is a weak inverter relative to the first inverter.

7. A method of operating a differential register, the differential register comprising a first pass gate having a first pass gate data input, a first pass gate enable input, and a first pass gate output; a first storage node having an input coupled to the first pass gate output and having an output; a second pass gate having a second pass gate data input connected to the output of the first storage node and the first pass gate output, a second pass gate enable input, and a second pass gate output; a first inverter having a first inverter input connected to the output of the first storage node and the first pass gate output and a first inverter output; a third pass gate having a third pass gate data input connected to the first inverter output, a third pass gate enable input, and a third pass gate output; a second storage node; an output node; and a complimentary output node, the method comprising the steps of:
receiving a data input signal on the first pass gate data input and a master clock signal on the first pass gate enable input;
conveying the data input signal from the first pass gate data input to the first pass gate data output and storing the data input signal on the output of the first storage node when the master clock signal is in a first master clock signal state;
receiving the stored data input signal on the second pass gate input and a slave clock signal on the second pass gate enable input;
conveying the stored data input signal from the second pass gate data input to the second pass gate data output for storage in the second storage node when the slave clock signal is in a first slave clock signal state, wherein the slave clock signal is a compliment to the master clock signal;
inverting the stored input data signal to generate an inverted stored input data signal;
receiving the inverted stored data input signal on the third pass gate input and the slave clock signal on the third pass gate enable input;
conveying the inverted stored data input signal from the third pass gate data input to the third pass gate data output for storage in the second storage node when the slave clock signal is in the first slave clock signal state; and
on power-up, conveying the stored data input signal stored in the second storage node out of the output node and conveying the inverted stored data input signal stored in the second storage node out of the complimentary output node regardless of states of the master clock signal and the slave clock signal.

8. A method of operating a differential register as set forth in claim 7 further comprising the step of conveying the stored data input signal stored in the second storage node out of the output node and conveying the inverted stored data input signal stored in the second storage node out of the complimentary output node in response to settling effects in the storage node.

* * * * *